(12) United States Patent
Bulatowicz et al.

(10) Patent No.: US 10,809,342 B2
(45) Date of Patent: *Oct. 20, 2020

(54) CALIBRATION OF A MAGNETOMETER SYSTEM

(71) Applicant: NORTHROP GRUMMAN SYSTEMS CORPORATION, Falls Church, VA (US)

(72) Inventors: Michael D. Bulatowicz, Sun Prairie, WI (US); Michael S. Larsen, Woodland Hills, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/722,678

(22) Filed: Oct. 2, 2017

(65) Prior Publication Data
US 2019/0101611 A1  Apr. 4, 2019

(51) Int. Cl.
*G01R 35/00* (2006.01)
*G01R 33/26* (2006.01)
*G01R 33/032* (2006.01)

(52) U.S. Cl.
CPC ....... *G01R 35/005* (2013.01); *G01R 33/0322* (2013.01); *G01R 33/26* (2013.01)

(58) Field of Classification Search
None
See application file for complete search history.

(56) References Cited

U.S. PATENT DOCUMENTS

| 4,157,495 A | 6/1979 | Grover et al. |
| 5,189,368 A | 2/1993 | Chase |

(Continued)

FOREIGN PATENT DOCUMENTS

| EP | 3410142 A1 | 12/2018 |
| JP | 2001092676 A | 4/2001 |

(Continued)

OTHER PUBLICATIONS

Savukov et al. (2017). "High Sensitivity operation of single-beam optically pumped magnetometer in kHz frequency range," Meas. Sci. Technol. vol. 28 No. 3, Feb. 2, 2017 (Feb. 2, 2017), pp. 035104.

(Continued)

*Primary Examiner* — Douglas X Rodriguez
(74) *Attorney, Agent, or Firm* — Tarolli, Sundheim, Covell & Tummino LLP

(57) ABSTRACT

One embodiment of the invention includes a magnetometer system. The system includes a sensor cell comprising alkali metal particles and at least one nuclear spin isotope. The system also includes a probe laser to provide a probe beam through the sensor cell to generate a detection beam, and a magnetic field system to generate magnetic fields through the sensor cell. The system also includes a detection system to implement detection of an external magnetic field based on characteristics of the detection beam in response to precession of the at least one nuclear spin isotope based on the magnetic fields. The system further includes a calibration controller configured to calibrate the magnetometer system based on implementing predetermined changes to the magnetic fields and monitoring the detection beam in a feedback manner.

20 Claims, 4 Drawing Sheets

(56) References Cited

U.S. PATENT DOCUMENTS

| | | | |
|---|---|---|---|
| 5,227,722 A | 7/1993 | Kostyk et al. | |
| 6,314,215 B1 | 11/2001 | Shay et al. | |
| 6,472,869 B1 | 10/2002 | Upschulte et al. | |
| 7,145,333 B2 | 12/2006 | Romalis et al. | |
| 7,521,928 B2 | 4/2009 | Romalis et al. | |
| 7,826,065 B1 | 11/2010 | Okandan et al. | |
| 7,856,065 B2 | 12/2010 | Jonsson | |
| 7,994,783 B2 | 8/2011 | Ledbetter et al. | |
| 8,054,074 B2 | 11/2011 | Ichihara et al. | |
| 8,212,556 B1 | 7/2012 | Schwindt et al. | |
| 8,300,566 B2 | 10/2012 | Kuo | |
| 8,305,078 B2 | 11/2012 | Savukov et al. | |
| 8,421,455 B1 | 4/2013 | Hovde et al. | |
| 8,519,705 B2 | 8/2013 | Savukov et al. | |
| 8,587,304 B2 | 11/2013 | Budker et al. | |
| 8,605,282 B2 | 12/2013 | Groswasser | |
| 9,116,201 B2 | 8/2015 | Shah et al. | |
| 9,140,657 B2 | 9/2015 | Ledbetter et al. | |
| 9,366,735 B2 | 6/2016 | Kawabata et al. | |
| 9,575,144 B2 | 2/2017 | Kornack et al. | |
| 9,618,362 B2 | 4/2017 | Bulatowicz et al. | |
| 9,638,768 B2 | 5/2017 | Foley et al. | |
| 9,645,205 B2* | 5/2017 | Larsen | G01R 33/26 |
| 9,857,441 B2 | 1/2018 | Salit et al. | |
| 9,869,731 B1 | 1/2018 | Hovde et al. | |
| 9,927,501 B2 | 3/2018 | Kim et al. | |
| 9,964,610 B2 | 5/2018 | Shah et al. | |
| 9,995,800 B1 | 6/2018 | Schwindt et al. | |
| 10,162,021 B2 | 12/2018 | Kawabata et al. | |
| 10,215,816 B2 | 2/2019 | Kawabata et al. | |
| 10,274,549 B1 | 4/2019 | Ledbetter et al. | |
| 10,288,701 B2 | 5/2019 | Kobayashi et al. | |
| 2004/0140799 A1 | 7/2004 | Romalis et al. | |
| 2005/0052650 A1 | 3/2005 | Wu | |
| 2008/0106261 A1* | 5/2008 | Romalis | G01R 33/24 324/304 |
| 2009/0243610 A1 | 10/2009 | Ichihara et al. | |
| 2009/0256561 A1 | 10/2009 | Ledbetter et al. | |
| 2010/0090697 A1 | 4/2010 | Savukov et al. | |
| 2010/0156547 A1 | 6/2010 | McGuyer et al. | |
| 2010/0289491 A1 | 11/2010 | Budker et al. | |
| 2010/0308814 A1 | 12/2010 | Wu | |
| 2011/0025323 A1 | 2/2011 | Budker et al. | |
| 2011/0193555 A1 | 8/2011 | Sugioka et al. | |
| 2011/0279115 A1 | 11/2011 | Tuchman | |
| 2012/0112749 A1 | 5/2012 | Budker et al. | |
| 2012/0113423 A1 | 5/2012 | Groswasser | |
| 2012/0176130 A1 | 7/2012 | Ledbetter et al. | |
| 2013/0027041 A1 | 1/2013 | Savukov et al. | |
| 2013/0214773 A1 | 8/2013 | Ueno | |
| 2013/0265042 A1 | 10/2013 | Kawabata et al. | |
| 2013/0328557 A1 | 12/2013 | Larsen et al. | |
| 2014/0111198 A1 | 4/2014 | Tuchman | |
| 2014/0159718 A1* | 6/2014 | Larsen | G01R 33/26 324/301 |
| 2014/0184216 A1 | 7/2014 | Walker et al. | |
| 2014/0206981 A1 | 7/2014 | Nagasaka | |
| 2014/0247045 A1 | 9/2014 | Kornack et al. | |
| 2014/0375313 A1 | 12/2014 | Salit et al. | |
| 2015/0042327 A1 | 2/2015 | Bulatowicz | |
| 2015/0212168 A1 | 7/2015 | Shah et al. | |
| 2015/0316625 A1 | 11/2015 | Bulatowicz | |
| 2015/0330786 A1 | 11/2015 | Bulatowicz et al. | |
| 2015/0346293 A1 | 12/2015 | Bulatowicz et al. | |
| 2016/0061913 A1* | 3/2016 | Kobayashi | G01R 33/26 324/305 |
| 2016/0116553 A1 | 4/2016 | Kim et al. | |
| 2016/0146909 A1 | 5/2016 | Kawabata et al. | |
| 2016/0223627 A1 | 8/2016 | Shah et al. | |
| 2016/0231395 A1 | 8/2016 | Foley et al. | |
| 2016/0296145 A1 | 10/2016 | Bajaj et al. | |
| 2016/0313417 A1 | 10/2016 | Kawabata et al. | |
| 2016/0334475 A1 | 11/2016 | Ueno | |
| 2017/0000375 A1 | 1/2017 | Demas et al. | |
| 2017/0276741 A1 | 9/2017 | Bulatowicz | |
| 2019/0250223 A1 | 8/2019 | Palacios Laloy | |
| 2019/0293736 A1 | 9/2019 | Bulatowcz Michael D | |

FOREIGN PATENT DOCUMENTS

| | | |
|---|---|---|
| JP | 2010118553 A | 5/2010 |
| JP | 2012068251 A | 4/2012 |
| JP | 2014115290 A | 6/2014 |
| JP | 2016085200 A | 5/2016 |
| JP | 2016109665 A | 6/2016 |
| JP | 2017173329 A | 9/2017 |
| WO | 2015/002684 A2 | 1/2015 |

OTHER PUBLICATIONS

European Search Report with search opinion corresponding to EP Patent Application No. 18 19 6183, dated Feb. 12, 2019.

European Office Action for Application No. 16 150 518.5 dated Jun. 19, 2019.

European Office Action for Application No. 19183917.4-1022 dated Dec. 4, 2019.

Japanese Office Action for Application No. 2018-185554 dated Oct. 1, 2019.

Non Final Office Action for U.S. Appl. No. 15/990,974 dated Mar. 27, 2020.

Patton B et al., "A Remotely Interrogated All-Optical Rb Magnetometer", Applied Physics Letters, American Institute of Physics, US, vol. 101, No. 8, Aug. 20, 2012, pp. 83502-83502, XP012164874, ISSN: 0003-6951, DOI: 10.1063/1.4747206 [retrieved on Aug. 21, 2012]figure 1.

European Article 94(3) EPC for Application No. 15 167 451.2-1022 dated Jul. 11, 2019.

Non Final Office Action for U.S. Appl. No. 16/053,535 dated May 1, 2020.

* cited by examiner

CALIBRATION OF A MAGNETOMETER SYSTEM

TECHNICAL FIELD

The present disclosure relates generally to sensor systems, and specifically to calibration of a magnetometer system.

BACKGROUND

Magnetometer systems, such as nuclear magnetic resonance (NMR) magnetometers and/or electron paramagnetic resonance (EPR) magnetometers, can include a cell that contains one or more alkali metal vapors, such as rubidium or cesium, which can exhibit precession characteristics that can be a function of an external magnetic field. Thus, the magnetometer system can be configured to detect the external magnetic field based on the precession characteristics of the alkali metal vapor(s). Typical magnetometer systems that implement detection of the external magnetic field in three vector axes implement a combination of multiple single-axis or dual-axis vector systems. Such magnetometer systems can typically exhibit sensitivities to dynamics or system misalignments when attempting to determine a whole field scalar measurement, which can result in inaccuracy. Thus, when high sensitivity and stability may be required in a dynamic environment, whole field scalar magnetometer systems are often implemented. However, such whole field scalar magnetometer systems cannot provide multi-axis measurements and typically exhibit a low-bandwidth in providing dynamic measurements.

SUMMARY

One embodiment of the invention includes a magnetometer system. The system includes a sensor cell comprising alkali metal particles and at least one nuclear spin isotope. The system also includes a probe laser to provide a probe beam through the sensor cell to generate a detection beam, and a magnetic field system to generate magnetic fields through the sensor cell. The system also includes a detection system to implement detection of an external magnetic field based on characteristics of the detection beam in response to precession of the at least one nuclear spin isotope based on the magnetic fields. The system further includes a calibration controller configured to calibrate the magnetometer system based on implementing predetermined changes to the magnetic fields and monitoring the detection beam in a feedback manner.

Another embodiment of the invention includes a method for calibrating a magnetometer system. The method includes applying a first magnetic field aligned with a first axis of three orthogonal axes in response to a first current, a second magnetic field approximately aligned with a second axis of the three orthogonal axes in response to a second current, and a third magnetic field approximately aligned with a third axis of the three orthogonal axes in response to a third current. The method also includes providing a probe beam through the sensor cell comprising alkali metal particles and at least one nuclear spin isotope. The method also includes monitoring a characteristic of precession of the at least one nuclear spin isotope in the sensor cell in response to at least one of the first, second, and third magnetic fields based on characteristics of a detection beam associated with the probe beam through the sensor cell. The method further includes controlling an amplitude of at least one of the first current, the second current, and the third current based on the detected characteristic of the precession of the at least one nuclear spin isotope in a feedback manner.

Another embodiment of the invention includes a combined nuclear magnetic resonance (NMR) and electron paramagnetic resonance (EPR) magnetometer system. The system includes a sensor cell comprising alkali metal particles and at least one nuclear spin isotope and a probe laser configured to provide a probe beam through the sensor cell to generate a detection beam. The system also includes a magnetic field system configured to generate a first magnetic field aligned with a first axis of three orthogonal axes associated with the sensor cell, a second magnetic field approximately aligned with a second axis of the three orthogonal axes, and a third magnetic field approximately aligned with a third axis of the three orthogonal axes. The system also includes a detection system configured to implement NMR detection and EPR detection of an external magnetic field based on characteristics of the detection beam in response to precession of the alkali metal particles and the at least one nuclear spin isotope based on the plurality of magnetic fields. The system further includes a calibration controller. The calibration controller includes a current controller configured to control a first current, a second current, and a third current that are associated with the first magnetic field, the second magnetic field, and the third magnetic field, respectively, the current controller being configured to square-wave modulate at least one of the first, second, and third currents about a DC baseline amplitude. The calibration controller further includes a frequency monitor configured to monitor the precession frequency of the at least one nuclear spin isotope at each modulated amplitude of the at least one of the first, second, and third currents to calibrate the combined EPR and NMR magnetometer system.

DETAILED DESCRIPTION

Figure 1:
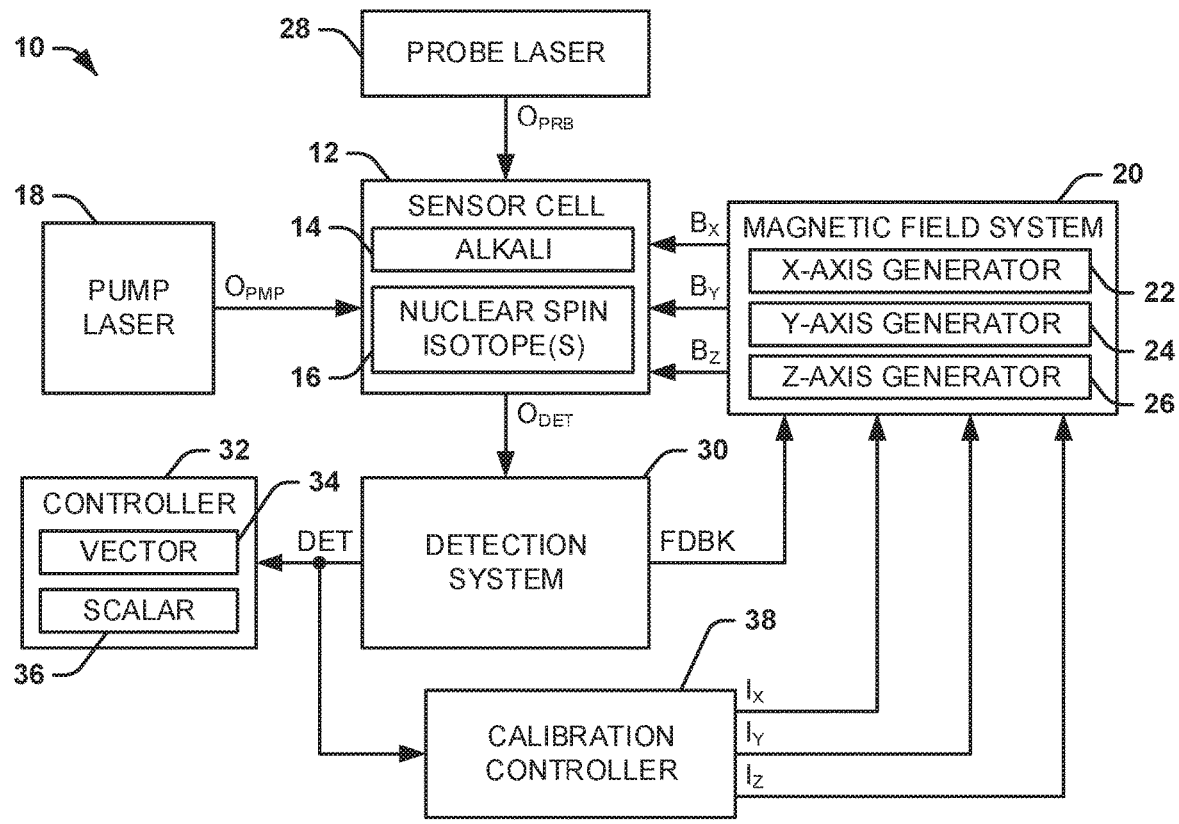
FIG. 1 illustrates an example of a magnetometer system.

The present disclosure relates generally to sensor systems, and specifically to calibration of a magnetometer system. A magnetometer system can include a sensor cell that includes alkali metal particles and at least one nuclear spin isotope. As an example, the alkali metal can be rubidium (Rb) or cesium (Cs), and the at least one nuclear spin isotope can be one or more xenon (Xe) isotopes. The system can include a magnetic field system that is configured to generate magnetic fields in each of the three orthogonal axes. In response to a first magnetic field, the alkali metal particles can be stimulated to precess in the sensor cell, along with the nuclear spin isotope(s) based on optical pumping of the alkali metal particles by an optical pump beam. The precession of the alkali metal particles can exhibit characteristics that are based in part on an external magnetic field, in that the precession can be about a total net DC magnetic field that is applied to the sensor cell. As described herein, the term "external magnetic field" refers to a magnetic field that is provided external to the magnetometer system, and thus corresponds to a magnetic field that is to be measured by the magnetometer system. Therefore, the magnetometer system can include a probe laser configured to provide a probe beam through the sensor cell, such that a Faraday rotation of the probe beam can be indicative of the characteristics of the precession of the alkali metal particles. In response, the magnetic field generator can be configured to control a magnetic field in each of two of the three orthogonal axes to substantially cancel out the external magnetic field in the two axes in a feedback manner based on the characteristics of the precession of the alkali metal particles. As a result, the remaining component of the external magnetic field is aligned with the third orthogonal axis. Accordingly, a magnitude of the external magnetic field can be measured in the two axes based on the controlled magnetic fields in an EPR manner.

The probe beam can also be implemented to determine a precession frequency of the nuclear spin isotope(s) based on a net effect of a magnetic field internal to the sensor cell upon the alkali metal particles. Upon determining the precession frequency of the nuclear spin isotope(s), the precession frequency can be compared with a substantially stable frequency reference, such as generated from a local oscillator. Because the precession of the nuclear spin isotope(s) depends on the net magnetic field in the third axis, the magnetic field system can be configured to control the magnetic field in the third axis to set the precession frequency approximately equal to the reference frequency in a feedback manner. Therefore, the magnitude of the external magnetic field can be measured in the third axis in an NMR manner, thus allowing measurement of the external magnetic field in the three orthogonal axes in a single sensor cell magnetometer system. A scalar magnitude of the external magnetic field can thus be determined by calculating the square-Root of the Sum of the Squares (RSS) of the vector components of the external magnetic field in the three orthogonal axes.

The magnetometer system can include a calibration controller that is configured to calibrate the magnetometer system based on predetermined control of the magnetic fields arranged approximately along the three orthogonal axes. For example, the calibration controller can include a current controller and a frequency monitor. The current controller can be configured to control a first current, a second current, and a third current associated with the respective first, second, and third magnetic fields that are approximately aligned with the three orthogonal axes through the sensor cell. The current controller can be configured to square-wave modulate the currents about respective DC baseline amplitudes in a sequence to calibrate the magnetometer system. The frequency monitor can be configured to monitor the precession frequency of the at least one nuclear spin isotope (e.g., $^{129}$Xe) at each modulated amplitude of the square-wave modulated currents to calibrate the magnetometer system in the feedback manner.

For example, the frequency monitor can be configured to adjust the respective DC baseline amplitude of the respective square-wave modulated current via a feedback signal to set the precession frequency at each square-wave modulated amplitude to be equal, thus corresponding to an approximately zero amplitude net magnetic field across the respective one of the orthogonal axes. In addition, the frequency monitor can monitor the precession frequency at each of a plurality of different square-wave modulation amplitudes of each of the magnetic fields based on the respective currents to calibrate a scale-factor associated with the current amplitudes relative to the magnetic field amplitudes. Furthermore, the calibration procedure can be performed in a test fixture, such that the magnetometer system can be rotated around each of the orthogonal axes in a predetermined manner to substantially mitigate magnetic anomalies associated with the test fixture.

FIG. 1 illustrates an example of a magnetometer system 10. As an example, the magnetometer system 10 can implement measurement characteristics of both an electron paramagnetic resonance (EPR) magnetometer and a nuclear magnetic resonance (NMR) magnetometer using a single sensor cell 12. The magnetometer system 10 can be implemented in any of a variety of applications that may require measurement of external and applied magnetic fields.

The sensor cell 12 can be, for example, a glass casing of any of a variety of shapes and sizes. The sensor cell 12 includes an alkali metal 14, as well as one or more nuclear spin isotopes 16. As an example, the alkali metal 14 can be rubidium (Rb) vapor, such as $^{85}$Rb, or cesium (Cs) vapor, such as $^{133}$Cs, and the nuclear spin isotope(s) 16 can include noble gas isotopes such as helium (He), krypton (Kr), or xenon (Xe) (e.g., $^{3}$He, $^{83}$Kr, $^{129}$Xe, and/or $^{131}$Xe). The magnetometer system 10 includes a pump laser 18 that is configured to generate an optical pump beam $O_{PMP}$ that is directed through the sensor cell 12 via a set of optics to stimulate (e.g., pump) the particles of the alkali metal 14 to a spin-polarized state. The spin-polarized particles of the alkali metal 14 can precess in the sensor cell 12 in response to an applied AC magnetic field, such as with the nuclear spin isotopes 16. In the example of FIG. 1, the magnetometer system 10 includes a magnetic field system 20 that is configured to generate magnetic fields in each of three orthogonal axes. Specifically, the magnetic field system includes an X-axis magnetic field generator 22 that generates a magnetic field $B_X$, a Y-axis magnetic field generator 24 that generates a magnetic field $B_Y$, and a Z-axis magnetic field generator 26 that generates a magnetic field $B_Z$. As an example, the magnetic field $B_Z$ can be an AC magnetic field having a DC component (i.e., DC offset) in the Z-axis, which can be substantially collinear with the pump beam $O_{PMP}$. Thus, based on a net DC magnetic field of the magnetic fields $B_X$, $B_Y$, and $B_Z$, in combination with the AC component of the magnetic field $B_Z$, the particles of the alkali metal 14 can precess in response to the magnetic field $B_Z$.

The precession of the particles of the alkali metal 14 can be about an axis that corresponds to a net DC magnetic field, including an external magnetic field which the magnetometer system 10 is configured to measure. The magnetometer system 10 also includes a probe laser 28 configured to generate a probe beam $O_{PRB}$ that is directed through the sensor cell 12, such as approximately orthogonally with respect to the pump beam $O_{PMP}$. The probe beam exiting the sensor cell 12, demonstrated in the example of FIG. 1 as $O_{DET}$, can exhibit characteristics that correspond to the precession of the particles of the alkali metal 14. For example, due to the birefringence of the spin-polarized alkali metal 14, the angle of precession of the particles of the alkali metal 14 can exhibit a Faraday rotation effect on a detection beam $O_{DET}$ associated with the probe beam $O_{PRB}$ provided through the sensor cell 12. The detection beam $O_{DET}$ exiting the sensor cell 12 is provided to a detection system 30 that is configured to determine the Faraday rotation of the detection beam $O_{DET}$, which can be indicative of the components of the net magnetic field in the XY-plane, which is substantially orthogonal to the pump beam $O_{PMP}$. Therefore, the detection system 30 can provide a feedback signal FDBK to the magnetic field system 20 to command the X-axis magnetic field generator 22 and the Y-axis magnetic field generator 24 to adjust the respective magnetic fields $B_X$ and $B_Y$ to substantially mitigate the Faraday rotation of the detection beam $O_{DET}$ in a feedback manner based on setting the components of the net magnetic field in the XY-plane to approximately zero to align the net magnetic field to the Z-axis. Thus, the magnitudes of the magnetic fields $B_X$ and $B_Y$ correspond to the opposite of the vector magnitudes of the external magnetic field in the respective X- and Y-axes. Accordingly, the magnetometer system 10 can implement EPR detection of the vector components of the external magnetic field in the X- and Y-axes based on determining characteristics of the precession of the particles of the alkali metal 14.

The vector magnitudes of the external magnetic field in the respective X- and Y-axes are provided to a controller 32 via a signal DET. The controller 32 has a vector component 34 and a scalar component 36, such that the controller 32 can measure or otherwise provide the magnitude of the external magnetic field as both a vector magnitude in three orthogonal axes via the vector component 34 and as a scalar magnitude via the scalar component 36. As an example, the controller 32 can store and/or substantially constantly update the values of the vector magnitudes of the external magnetic field in the respective X- and Y-axes via the vector component 34. Accordingly, the magnetometer system 10 can operate substantially similar to the magnetometer system described in U.S. patent application Ser. No. 13/711,199, filed 11 Dec. 2012, Publication No. US 2014-0159718, published 12 Jun. 2014, now U.S. Pat. No. 9,645,205, issued 9 May 2017, entitled "COMBINED ELECTRON PARAMAGNETIC RESONANCE (EPR) AND NUCLEAR MAGNETIC RESONANCE (NMR) MAGNETOMETER SYSTEM", incorporated herein by reference in its entirety.

In addition, the magnetometer system 10 includes a calibration controller 38 that is configured to calibrate the magnetometer system 10. The calibration controller 38 can be implemented to do off-line calibration of the magnetometer system 10, such as in a test fixture, to determine a scale-factor of the applied magnetic fields $B_X$, $B_Y$, and $B_Z$ relative to currents $I_X$, $I_Y$, and $I_Z$ that generate the respective magnetic fields $B_X$, $B_Y$, and $B_Z$, and to calibrate the magnetometer system 10 with respect to a zero net baseline magnetic field along each of the three orthogonal axes. Thus, the calibration controller 38 can be configured to substantially mitigate errors in the detected external magnetic field that can result from bias, temperature, or other sources of the errors.

In the example of FIG. 1, the calibration controller is configured to control the currents $I_X$, $I_Y$, and $I_Z$ that are provided to the magnetic field system 20. The currents $I_X$, $I_Y$, and $I_Z$ correspond, respectively, to the X-axis magnetic field generator 22, the Y-axis magnetic field generator 24, and the Z-axis magnetic field generator 26 that generate the respective magnetic fields $B_X$, $B_Y$, and $B_Z$. While the example of FIG. 1 demonstrates that the calibration controller 38 is a separate component with respect to the magnetic field system 20, it is to be understood that a current controller that controls or generates the currents $I_X$, $I_Y$, and $I_Z$ can correspond to the separate current controllers associated with the X-axis magnetic field generator 22, the Y-axis magnetic field generator 24, and the Z-axis magnetic field generator 26, respectively. Additionally, while the magnetic fields that are described herein are generated to be approximately orthogonal with respect to each other, and are selected to be demodulated along three-orthogonal axes, as described in greater detail herein, it is to be understood that the magnetic fields can be generated at different (e.g., non-orthogonal) angles with respect to each other, such that the demodulation of the calibration scheme can be provided at angles having predetermined relationships with each other and which correspond approximately to the generated magnetic fields.

In the example of FIG. 1, the calibration controller 38 is configured to control the currents $I_X$, $I_Y$, and $I_Z$ based on the precession of one of the nuclear spin isotope(s) 16, as indicated via the signal DET. For example, the nuclear spin isotope(s) 16 can be $^{129}$Xe and $^{131}$Xe, which can each have a predetermined precession frequency per unit magnetic field (i.e., the gyromagnetic ratio) that can be identified to the part per million accuracy level. Given that the $^{131}$Xe nuclear spin isotope 16 has a 3/2 nuclear spin, and therefore a multi-pole moment, and given that the $^{129}$Xe nuclear spin isotope 16 has a ½ nuclear spin, and therefore only a magnetic dipole moment, the signal DET can be implemented to monitor the precession frequency of the $^{129}$Xe nuclear spin isotope 16 to provide a more accurate reference for calibration. Therefore, the calibration controller 38 can use the frequency reference provided by the $^{129}$Xe nuclear spin isotope 16 in response to controlling the currents $I_X$, $I_Y$, and $I_Z$ to determine a scale factor of the magnetometer system with respect to the magnetic fields $B_X$, $B_Y$, and $B_Z$, and can determine an amplitude of the currents $I_X$, $I_Y$, and $I_Z$ that correspond to a net zero magnetic field along each of the X, Y, and Z-axes, respectively to provide accurate calibration of the magnetometer system 10, as described in greater detail herein.

Figure 2:
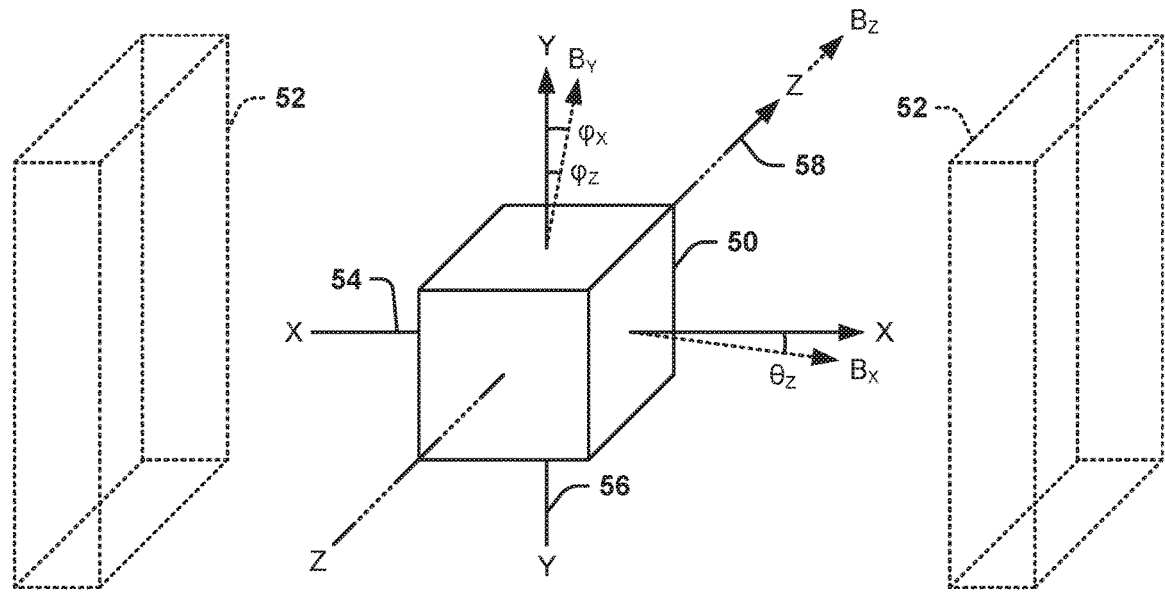
FIG. 2 illustrates an example of a sensor cell.

FIG. 2 illustrates an example of a sensor cell 50 arranged with respect to a test fixture 52 within which the sensor cell 50 resides during a calibration procedure. The test fixture 52 can correspond to a substantially magnetically-shielded environment in which a calibration procedure can be performed. As an example, the sensor cell 50 can correspond to the sensor cell 12 in the example of FIG. 1, and thus, reference is to be made to the example of FIG. 1 in the following description of the example of FIG. 2. The sensor cell 50 is demonstrated in the example of FIG. 2, as being oriented with respect to the three orthogonal axes. Specifically, the example of FIG. 2 demonstrates the X-axis 54, the Y-axis 56, and the Z-axis 58 corresponding to the three orthogonal axes that define the sensitive axes of the magnetometer system 10. The X-axis 54, the Y-axis 56, and the Z-axis 58 can correspond to three orthogonal axes with which the magnetic fields $B_X$, $B_Y$, and $B_Z$ are approximately aligned. Because it is almost impossible to align the X-axis magnetic field generator 22, the Y-axis magnetic field generator 24, and the Z-axis magnetic field generator 26 to the specific respective X-axis 54, the Y-axis 56, and the Z-axis 58, the calibration controller 38 can be configured to designate the orientation of the magnetic fields $B_X$, $B_Y$, and $B_Z$ through the sensor cell 50.

As an example, the calibration controller 38 can be configured to designate the Z-axis 58 as a principal axis that is precisely aligned with the magnetic field $B_Z$, such that the calibration controller 38 defines the magnetic field $B_Z$ as corresponding precisely to the Z-axis 58. In the example of FIG. 2, the magnetic field $B_Z$ is demonstrated as a vector "$B_Z$" that is collinear with respect to the Z-axis 58. As a result, the Z-axis 58 is defined to include zero projection components in the X-axis 54 or the Y-axis 56, such that the magnetic field $B_Z$ includes zero net magnetic field components in the X-axis 54 or the Y-axis 56. Similarly, the calibration controller 38 can be configured to designate the X-axis 54 as a second axis that is coplanar with the Y-axis 56 and orthogonal to the Z-axis 58. Therefore, the magnetic field $B_X$ is defined as residing in the XZ-plane with a primary magnetic field component along the X-axis 54 and a secondary magnetic field component along the Z-axis 58 and zero net magnetic field component along the Y-axis 56. In the example of FIG. 2, the magnetic field $B_X$ is demonstrated as a vector "$B_X$" that is offset with respect to the X-axis 54 by an offset angle $\theta_Z$, with the offset angle $\theta_Z$ corresponding to an offset angle of the magnetic field $B_X$ relative to the X-axis 54 and is contained in the XZ-plane formed by the X-axis 54 and the Z-axis 58. Similarly, the calibration controller 38 can be configured to designate the Y-axis 56 as a third axis that is orthogonal to both the X-axis 54 and the Z-axis 58. Therefore, the magnetic field $B_Y$ includes a primary magnetic field component along the Y-axis 56, and secondary magnetic field components along the X-axis 54 and the Z-axis 58. In the example of FIG. 2, the magnetic field $B_Y$ is demonstrated as a vector "$B_Y$". The magnetic field $B_Y$ is offset with respect to the Y-axis 56 by a first offset angle $\varphi_X$ corresponding to an offset angle of the magnetic field $B_Y$ relative to the plane of the Y-axis 56 and the Z-axis 58, and a second offset angle $\varphi_Z$ corresponding to an offset angle of the magnetic field $B_Y$ relative to the XY-plane of the X-axis 54 and the Y-axis 56.

Figure 3:
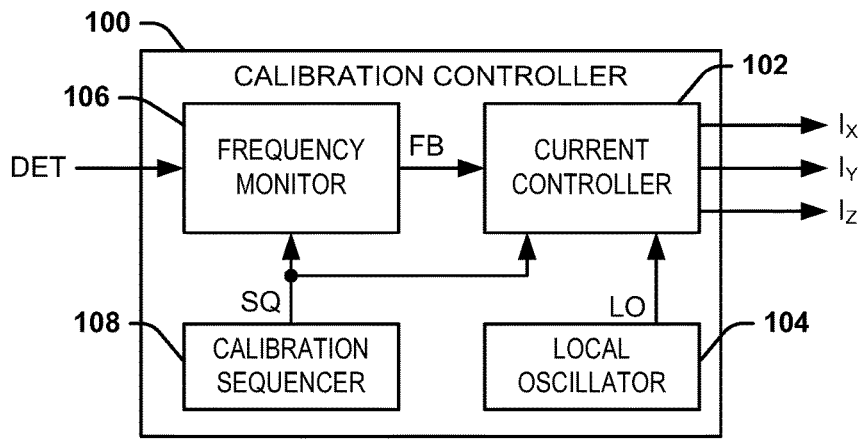
FIG. 3 illustrates an example of a calibration controller.

FIG. 3 illustrates an example of a calibration controller 100. The calibration controller 100 can correspond to the calibration controller 38 in the example of FIG. 1. Therefore, reference is to be made to the example of FIG. 1 in the following description of the example of FIG. 3.

The calibration controller 100 includes a current controller 102 that is configured to control amplitudes of the currents $I_X$, $I_Y$, and $I_Z$, respectively. The currents $I_X$, $I_Y$, and $I_Z$ correspond, respectively, to the X-axis magnetic field generator 22, the Y-axis magnetic field generator 24, and the Z-axis magnetic field generator 26 in the example of FIG. 1 that generate the respective magnetic fields $B_X$, $B_Y$, and $B_Z$. As an example, the current controller 102 can generate the currents $I_X$, $I_Y$, and $I_Z$ that generate the magnetic fields $B_X$, $B_Y$, and $B_Z$, respectively. As another example, the current controller 102 can provide control signals to separate current controllers associated with the X-axis magnetic field generator 22, the Y-axis magnetic field generator 24, and the Z-axis magnetic field generator 26, respectively, to control the respective amplitudes of the currents $I_X$, $I_Y$, and $I_Z$, and thus the respective amplitudes of the magnetic fields $B_X$, $B_Y$, and $B_Z$.

As an example, the current controller 102 can be configured to square-wave modulate each of the currents $I_X$, $I_Y$, and $I_Z$ about respective DC baseline amplitudes to provide alternating modulated amplitudes of the respective magnetic fields $B_X$, $B_Y$, and $B_Z$. In the example of FIG. 3, the calibration controller 100 includes a local oscillator 104 that is configured to generate an oscillator signal LO having a predetermined frequency (e.g., a relatively low frequency, such as in the order of Hz) that is provided to the current controller 102 to facilitate the square-wave modulation of one or more of the currents $I_X$, $I_Y$, and $I_Z$ at the frequency of the oscillator signal LO. As an example, the DC baseline amplitude can have a nominal amplitude of approximately zero, such that in ideal operating conditions, the square-wave modulation of the currents $I_X$, $I_Y$, and $I_Z$ can provide equal and opposite amplitudes of the currents $I_X$, $I_Y$, and $I_Z$, and thus equal and opposite amplitudes of the respective magnetic fields $B_X$, $B_Y$, and $B_Z$, thus corresponding to a net zero time-averaged magnetic field amplitude about the DC baseline amplitude (e.g., at zero amperes) with respect to a given one of the orthogonal axes. However, due to inherent variations in manufacturing conditions, temperature, or other sources of bias, the DC baseline amplitude may be non-zero to provide a net-zero magnetic field across a respective one of the orthogonal axes. Therefore, the current controller 102 is further configured to adjust the DC baseline amplitude of the respective currents $I_X$, $I_Y$, and $I_Z$ in a feedback manner during a calibration procedure.

In the example of FIG. 3, the calibration controller 100 also includes a frequency monitor 106 that is configured to monitor a precession frequency associated with at least one of the nuclear spin isotopes 16 in the sensor cell 12. In the example of FIG. 3, the frequency monitor 106 receives the signal DET that is associated with the optical detection beam $O_{DET}$, and which can thus provide an indication of the precession frequency of the nuclear spin isotope 16. Therefore, during a calibration procedure, the frequency monitor 106 can monitor the precession frequency of the nuclear spin isotope 16 at each modulated amplitude of a respective one or more of the currents $I_X$, $I_Y$, and $I_Z$ and can provide a feedback signal FB corresponding to the precession frequency to the current controller 102. As a result, the frequency monitor 106 can determine the DC baseline amplitude that corresponds to the net zero amplitude of one or more of the respective magnetic fields $B_X$, $B_Y$, and $B_Z$ along the respective one or more of the orthogonal axes. For example, the frequency monitor 106 can determine the DC baseline amplitude of the respective one or more of the currents $I_X$, $I_Y$, and $I_Z$ based on a determination of the precession frequency of the nuclear spin isotope 16 being approximately equal at the positive and negative modulated amplitudes of the respective one of the currents $I_X$, $I_Y$, and $I_Z$. Therefore, the current controller 102, in response to the feedback signal FB, can adjust the DC baseline amplitude of the respective one of the currents $I_X$, $I_Y$, and $I_Z$ to set the precession frequency corresponding to each of the modulated amplitudes to an approximately equal value.

As described in the example of FIG. 2, the calibration controller 100 can be configured to designate the Z-axis as a principal axis that is precisely aligned with the magnetic field $B_Z$, such that the calibration controller 38 defines the magnetic field $B_Z$ as corresponding precisely to the Z-axis. As a result, the magnetic field $B_Z$ is defined to include zero net magnetic field components along the X-axis 54 or the Y-axis 56. Therefore, the calibration controller 100 can calibrate the Z-axis with respect to a determination of a net zero magnetic field along the Z-axis based solely on the definition of the magnetic field $B_Z$ along the Z-axis. The magnetic field $B_Z$ can have both a net DC component and an AC component to drive the alkali EPR, and thus the measurement of the magnetic fields along both the X-axis 54 and the Y-axis 56. Because the magnetic field $B_Z$ has, by definition, no component along either the X-axis 54 or the Y-axis 56, the operation of the alkali EPR magnetometer for measuring the magnetic fields $B_X$ and $B_Y$ can continue to utilize modulations on the magnetic field $B_Z$ without interfering with measurements of the magnetic fields $B_X$ or $B_Y$.

However, because the X-axis is defined as a second axis that is coplanar with the Y-axis, the X-axis is aligned in the XY plane, such that the magnetic field $B_X$ includes a magnetic field component along the X-axis 54 primarily, and a magnetic field component along the Z-axis 58. Therefore, the current controller 102 can square-wave modulate the current $I_X$ at each of two separate amplitudes of the current $I_Z$ to calibrate the magnetometer system 10 with respect to the X-axis. Similarly, because the Y-axis 56 is defined as a third axis that is orthogonal to the X-axis and the Z-axis, the magnetic field $B_Y$ includes a magnetic field component along the Y-axis 56 primarily, and magnetic field components along the X-axis 54 and the Z-axis 58. Therefore, the current controller 102 can likewise square-wave modulate the current $I_Y$ at each of two separate amplitudes of the current $I_Z$ to calibrate the magnetometer system 10 with respect to the Y-axis. In the example of FIG. 3, the calibration component 100 further includes a calibration sequencer 108 that is configured to provide a signal SQ to the frequency monitor 106 and the current controller 102 to define a calibration sequence. As an example, the calibration sequencer 108 can define sequential calibration of the magnetometer system 10 which includes determining a magnetic field null along the X-axis, determining a magnetic field null along the Y-axis, and determining a scale-factor calibration of the magnetometer system 10 along each of the X-axis, Y-axis, and Z-axis.

Figure 4:
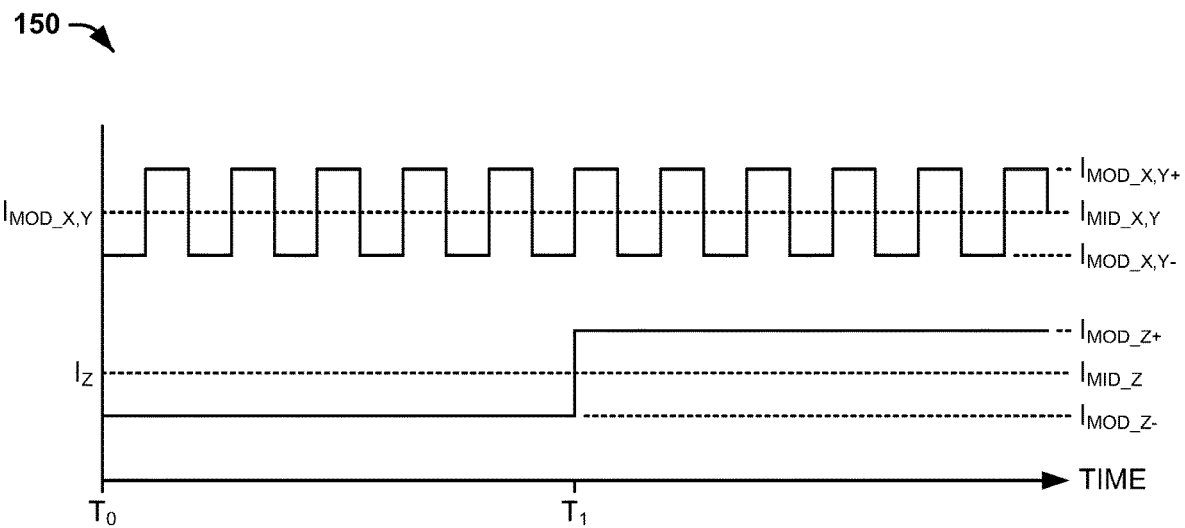
FIG. 4 illustrates an example of a timing diagram.

FIG. 4 illustrates an example of a timing diagram 150. The timing diagram 150 demonstrates a current $I_{MOD\_X,Y}$ that corresponds to one of the currents $I_X$ or $I_Y$, depending on which of the orthogonal axes is being calibrated at a given time during the calibration procedure (e.g., based on the calibration sequencer 108). For example, the current $I_{MOD\_X,Y}$ can correspond to the current $I_X$ during calibration of the X-axis while the current $I_Y$ can be held at a zero amplitude, or the current $I_{MOD\_X,Y}$ can correspond to the current $I_Y$ during calibration of the Y-axis while the current $I_X$ can be held at a zero amplitude. The timing diagram 150 also demonstrates the current $I_Z$.

In the example of FIG. 4, the current $I_{MOD\_X,Y}$ is square-wave modulated about an amplitude $I_{MID\_X,Y}$, such that the current $I_{MOD\_X,Y}$ oscillates between a first amplitude $I_{MOD\_X,Y+}$ and a second amplitude $I_{MOD\_X,Y-}$. As an example, the square-wave modulation can be based on the oscillator signal LO, such that the current $I_{MOD\_X,Y}$ is modulated at the frequency of the oscillator signal LO. At a time $T_0$, the current $I_Z$ has an amplitude $I_{MOD\_Z-}$ relative to an amplitude $I_{MID\_Z}$. As an example, the amplitude $I_{MID\_Z}$ can correspond to zero amplitude. Thus, the frequency monitor 106 can monitor the precession frequency of the nuclear spin isotope 16 at each of the amplitudes $I_{MOD\_X,Y+}$ and $I_{MOD\_X,Y-}$ based on the signal DET, and can provide an indication in the difference between the precession frequency at the amplitude $I_{MOD\_X,Y+}$ relative to the amplitude $I_{MOD\_X,Y-}$ to the current controller 102 via the feedback signal FB. Therefore, the current controller 102 can adjust the amplitude $I_{MID\_X,Y}$ based on the feedback signal FB to set the precession frequency of the nuclear spin isotope 16 at the amplitude $I_{MOD\_X,Y+}$ to be equal to the precession frequency of the nuclear spin isotope 16 at the amplitude $I_{MOD\_X,Y-}$.

At a time $T_1$, the amplitude of the current $I_Z$ switches from the amplitude $I_{MOD\_Z-}$ to the amplitude $I_{MOD\_Z+}$. Thus, at the time $T_1$, the frequency monitor 104 can again monitor the precession frequency of the nuclear spin isotope 16 at each of the amplitudes $I_{MOD\_X,Y+}$ and $I_{MOD\_X,Y-}$ based on the signal DET, and can provide an indication in the difference between the precession frequency at the amplitude $I_{MOD\_X,Y+}$ relative to the amplitude $I_{MOD\_X,Y-}$ to the current controller 102 via the feedback signal FB. Therefore, the current controller 102 can again adjust the amplitude $I_{MID\_X,Y}$ based on the feedback signal FB to set the precession frequency of the nuclear spin isotope 16 at the amplitude $I_{MOD\_X,Y+}$ to be equal to the precession frequency of the nuclear spin isotope 16 at the amplitude $I_{MOD\_X,Y-}$. The current controller 102 can thus determine the DC baseline amplitude of the amplitude $I_{MID\_X,Y}$, and thus the respective one of the current $I_X$ and $I_Y$, that corresponds to a zero net magnetic field along the respective one of the X-axis and Y-axis, based on an average of the amplitude $I_{MID\_X,Y}$ during the $I_{MOD\_Z-}$ amplitude and the $I_{MOD\_Z+}$ amplitude of the current $I_Z$. In other words, by determining the amplitude $I_{MID\_X,Y}$ at each of the $I_{MOD\_Z-}$ amplitude and the $I_{MOD\_Z+}$ amplitude of the current $I_Z$ that corresponds to the equal precession frequency of the nuclear spin isotope 16 at each of the modulated amplitudes $I_{MOD\_X,Y+}$ and $I_{MOD\_X,Y-}$, the effects of X-axis direction or Y-axis components of the respective one of the magnetic fields $B_X$ and $B_Y$ is separated from the Z-axis components produced by the corresponding one of the respective magnetic field generators 22 and 24. Therefore, the true null magnetic field amplitude along the respective one of the X-axis or Y-axis is achieved when the DC magnetic field coil drive corresponding to the DC component of the current $I_X$ or $I_Y$, respectively, is halfway between the NMR perceived null at the amplitude $I_{MOD\_Z+}$ and the NMR perceived null at the amplitude $I_{MOD\_Z-}$ associated with the current $I_Z$, and thus the associated magnetic field amplitudes of the magnetic field $B_Z$.

The methodology described previously of determining the magnetic field null corresponding to the net zero magnetic field amplitude corresponds to both the X-axis and the Y-axis, such as performed one at a time in sequence. However, as described previously, the Y-axis 56 is defined as a third axis that is orthogonal to the X-axis and the Z-axis, the magnetic field $B_Y$ includes magnetic field components along the X-axis 54 and the Z-axis 58. Therefore, the calibration controller 100 implements a trigonometric relationship between the three orthogonal axes to separate the components of the magnetic field $B_X$ from the determination of the null of the magnetic field $B_Y$ along the respective Y-axis. As an example, the EPR portion of the magnetometer system 10 can be implemented to measure the components of the magnetic field $B_Y$ that are parallel to X-axis based on the demodulation scheme of the optical detection beam $O_{DET}$ that provides that the demodulation of the Y-axis magnetic field component of the external magnetic field is selected to be 90 degrees out-of-phase with the demodulation of the X-axis magnetic field component of the external magnetic field. The calibration of the Y-axis can thus be performed by applying an AC signal to the Y-axis magnetic field generator 24 and measuring the ratio of the magnetic field measured along the X-axis to the magnetic field measured along the Y-axis (e.g., as corrected by the EPR magnetometer sensitivity model). The measured ratio is selected to provide the tangent of the angle between the X-axis and the magnetic field $B_Y$ in the X-Y plane. This angle can then be used to correct the individual X and Y null settings (e.g., associated with the respective DC baseline amplitudes of the currents $I_X$ and $I_Y$) to achieve a true null magnetic field on both the X-axis and the Y-axis.

Figure 5:
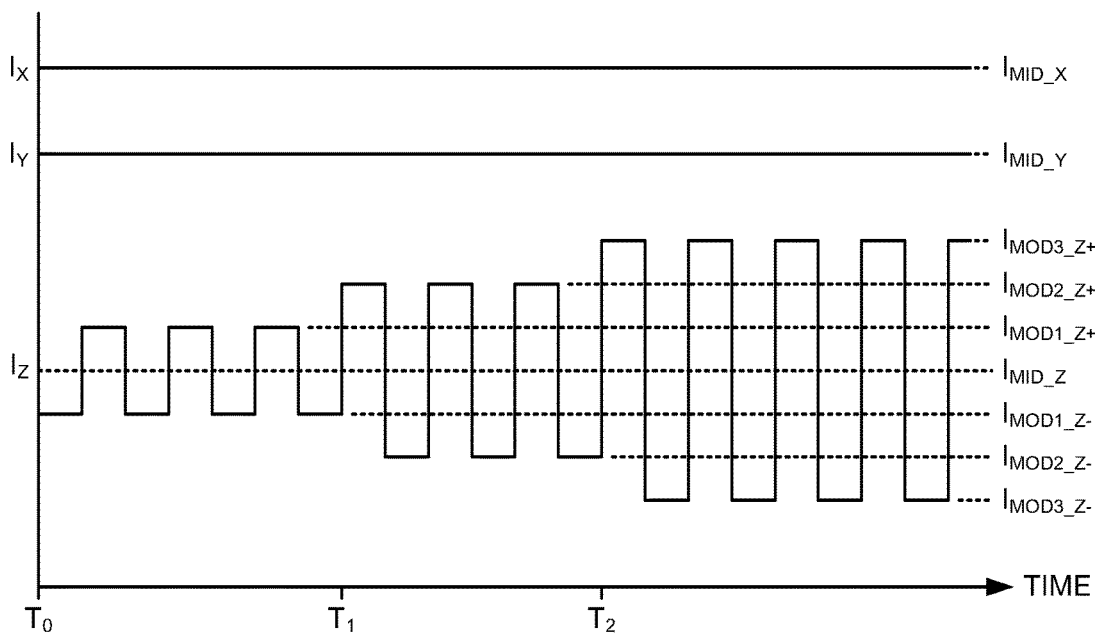
FIG. 5 illustrates another example of a timing diagram.

FIG. 5 illustrates another example of a timing diagram 200. The timing diagram 200 demonstrates the current $I_X$, the current $I_Y$, and the current $I_Z$. The timing diagram 200 demonstrates the square-wave modulation of the current $I_Z$ for scale-factor calibration of the current $I_Z$ with respect to the magnetic field $B_Z$. During scale-factor calibration of the magnetic field $B_Z$, the current $I_X$ can be controlled to have an amplitude $I_{MID\_X}$ that can correspond to the determined DC baseline amplitude that results in a zero net magnetic field along the X-axis, such as based on the calibration procedure described previously with respect to the examples of FIGS. 3 and 4. Similarly, the current $I_Y$ can be controlled to have an amplitude $I_{MID}$ Y that can correspond to the determined DC baseline amplitude that results in a zero net magnetic field along the Y-axis, such as based on the calibration procedure described previously with respect to the examples of FIGS. 3 and 4.

At a time $T_0$, the current $I_Z$ is square-wave modulated (e.g., at the frequency of the oscillation signal LO) about the DC baseline amplitude $I_{MID\_Z}$ between a first modulated amplitude $I_{MOD1\_Z+}$ and a second modulated amplitude $I_{MOD1\_Z-}$. At each of the modulated amplitudes $I_{MOD1\_Z+}$ and $I_{MOD1\_Z-}$, the calibration controller 100 can record the precession frequency of the nuclear magnetic isotope 16. At a time $T_1$, the current controller 102 can change the square-wave modulation of the current $I_Z$, such that the current $I_Z$ is square-wave modulated about the DC baseline amplitude $I_{MID\_Z}$ between a first modulated amplitude $I_{MOD2\_Z+}$ and a second modulated amplitude $I_{MOD2\_Z-}$, each having a greater absolute value amplitude than the respective modulated amplitudes $I_{MOD1\_Z+}$ and $I_{MOD1\_Z-}$. Therefore, at each of the modulated amplitudes $I_{MOD2\_Z+}$ and $I_{MOD2\_Z-}$, the calibration controller 100 can record the precession frequency of the nuclear magnetic isotope 16. Furthermore, at a time $T_2$, the current controller 102 can change the square-wave modulation of the current $I_Z$, such that the current $I_Z$ is square-wave modulated about the DC baseline amplitude $I_{MID\_Z}$ between a first modulated amplitude $I_{MOD3\_Z+}$ and a second modulated amplitude $I_{MOD3\_Z-}$, each having a greater absolute value amplitude than the respective modulated amplitudes $I_{MOD2\_Z+}$ and $I_{MOD2\_Z-}$.

The calibration controller 100 can thus determine a correlation between the amplitude of the current $I_Z$ and the effect on the precession frequency of the nuclear spin isotope 16 based on the generated magnetic field $B_Z$. Having already determined the DC baseline amplitudes of the currents $I_X$ and $I_Y$ to determine true nulls along the X-axis and the Y-axis, respectively, the calibration controller 100 can distinguish between the effects of the magnetic fields in the X-Y plane and the effects of non-linearity in the Z-axis magnetic field generator 26. Thus, the calibration controller 100 can generate a calibration curve based on the different discrete amplitudes of the magnetic field $B_Z$ generated at each of the respective current amplitudes $I_{MOD1\_Z}$, $I_{MOD2\_Z}$, and $I_{MOD3\_Z}$. Thus, calibration of an absolute change to the magnetic field $B_Z$, as provided via the Z-axis magnetic field generator 26, relative to change in the current $I_Z$ can be determined to account for any non-linearity in the Z-axis magnetic field generator 26 (e.g., including the combination of the coil, drive electronics, and the connections therein). While the example of FIG. 5, demonstrates only three separate modulation amplitudes, $I_{MOD1\_Z}$, $I_{MOD2\_Z}$, and $I_{MOD3\_Z}$, it is to be understood that the square-wave modulation of the current $I_Z$ can include more (e.g., four or more) or less (e.g., one or two) separate discrete modulated amplitudes to calibrate the scale-factor.

In addition, upon calibration of the Z-axis scale-factor, the absolute magnetic field $B_Z$ from the Z-axis magnetic field generator 26 can be determined by measuring the remaining offset due to the magnetic field component produced by the polarized alkali vapor 14. The largest component of the alkali field offset can be along the Z-axis, such as based on the topology of providing the pump beam OPMP along the Z-axis, but can also have components along X-axis and Y-axis. By varying the power of the pump laser 18 and monitoring the corresponding changes in the precession frequency of the nuclear spin isotope 16, a calibration curve can be generated. The calibration curve can be extrapolated back to a zero alkali field to determine the absolute Z-axis magnetic field generator 26 offset. As an example, the calibration controller 100 can repeat the process for both positive and negative amplitudes of the magnetic field $B_Z$, for both positive and negative amplitudes of the optical pump beam $O_{PMP}$, and for both positive and negative amplitudes of the optical probe beam $O_{PRB}$ (e.g., and thus the detection beam $O_{DET}$), as well as various intensities of the optical probe beam $O_{PRB}$. Therefore, the calibration controller 100 can accurately determine the alkali field offset, the true offset of the magnetic field $B_Z$, and the alkali field dependence on power of the optical probe beam $O_{PRB}$, and can accommodate non-ideal linear polarization of the optical probe beam $O_{PRB}$.

Figure 6:
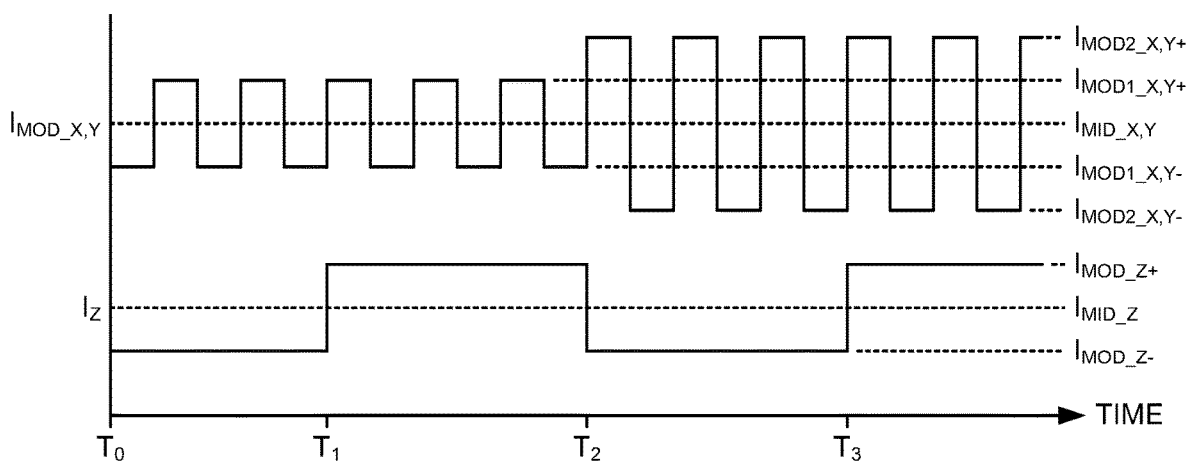
FIG. 6 illustrates yet another example of a timing diagram.

FIG. 6 illustrates yet another example of a timing diagram 250. The timing diagram 250 demonstrates the current $I_{MOD\_X,Y}$ that corresponds to one of the currents $I_X$ or $I_Y$, depending on which of the orthogonal axes is being scale-factor calibrated at a given time during the calibration procedure (e.g., based on the calibration sequencer 108). For example, the current $I_{MOD\_X,Y}$ can correspond to the current $I_X$ during calibration of the X-axis while the current $I_Y$ can be held at a zero amplitude, or the current $I_{MOD\_X,Y}$ can correspond to the current $I_Y$ during calibration of the Y-axis while the current $I_X$ can be held at a zero amplitude. The timing diagram 150 also demonstrates the current $I_Z$.

In the example of FIG. 6, the current $I_{MOD\_X,Y}$ is square-wave modulated about the amplitude $I_{MID\_X,Y}$, having already been determined to correspond to a null magnetic field across the respective one of the X-axis and the Y-axis. At a time $T_0$, the current $I_{MOD\_X,Y}$ oscillates between an amplitude $I_{MOD1\_X,Y+}$ and an amplitude $I_{MOD1\_X,Y-}$, such as based on the frequency of the oscillator signal LO. At the time $T_0$, the current $I_Z$ has an amplitude $I_{MOD\_Z-}$ relative to the amplitude $I_{MID\_Z}$ (e.g., zero amplitude). Thus, the frequency monitor 106 can monitor the precession frequency of the nuclear spin isotope 16 at each of the amplitudes $I_{MOD1\_X,Y+}$ and $I_{MOD1\_X,Y-}$ based on the signal DET at the $I_{MOD\_Z-}$ amplitude of the current $I_Z$. At a time $T_1$, the current $I_Z$ has an amplitude $I_{MOD\_Z+}$ relative to the amplitude $I_{MID\_Z}$. Thus, the frequency monitor 106 can again monitor the precession frequency of the nuclear spin isotope 16 at each of the amplitudes $I_{MOD1\_X,Y+}$ and $I_{MOD1\_X,Y-}$ based on the signal DET at the $I_{MOD\_Z-}$ amplitude of the current $I_Z$.

At a time $T_2$, the current controller 102 can increase the absolute value modulated amplitude of the current $I_{MOD\_X,Y}$ from $I_{MOD1\_X,Y+}$ and $I_{MOD1\_X,Y-}$ to $I_{MOD2\_X,Y+}$ and $I_{MOD2\_X,Y-}$, respectively. Therefore, similar to as described previously, at the time $T_2$, the current $I_Z$ has an amplitude $I_{MOD\_Z-}$ relative to the amplitude $I_{MID\_Z}$, and the frequency monitor 106 can monitor the precession frequency of the nuclear spin isotope 16 at each of the amplitudes $I_{MOD2\_X,Y+}$ and $I_{MOD2\_X,Y-}$ based on the signal DET at the $I_{MOD\_Z-}$ amplitude of the current $I_Z$. At a time $T_3$, the current $I_Z$ has an amplitude $I_{MOD\_Z+}$ relative to the amplitude $I_{MID\_Z}$, and the frequency monitor 106 can again monitor the precession frequency of the nuclear spin isotope 16 at each of the amplitudes $I_{MOD2\_X,Y+}$ and $I_{MOD2\_X,Y-}$ based on the signal DET at the $I_{MOD\_Z-}$ amplitude of the current $I_Z$. The current controller 102 can thus continue the square-wave modulation at increasing discrete amplitudes and can generate respective calibration curves, similar to as described previously in the example of FIG. 5. Accordingly, the calibration component 100 can provide scale-factor calibration of the magnetometer system 10 along the X-axis and along the Y-axis in response to the calibration curves generated based on the discrete separate amplitudes of the currents $I_X$ and $I_Y$ at each of the amplitudes $I_{MOD\_Z+}$ and $I_{MOD\_Z-}$ of the current $I_Z$.

The calibration controller 100 can also be configured to calibrate the magnetometer system 10 with respect to sensor bias on all three of the orthogonal axes. As an example, the calibration component 100 can be configured to measure X-axis and Y-axis sensor bias values by rotating the magnetometer system 10 at a known rate and/or to multiple known orientations of the magnetometer system 10 about the Z-axis while performing the magnetic field null calibration, as described previously regarding the examples of FIGS. 3 and 4, and separating DC and AC components of the measured magnetic fields $B_X$ and $B_Y$ on each of the respective X-axis and Y-axis. The DC portion of the respective magnetic fields $B_X$ and $B_Y$ can correspond to the sensor bias of the magnetometer system 10. However, the AC portion of the respective magnetic fields $B_X$ and $B_Y$ at the rotation frequency can correspond to the test fixture environment. Therefore, the calibration component 100 can separate the sensor bias from the rotation to determine magnetic anomalies associated with the test fixture, such that the magnetic anomalies can be canceled in the measurement of the external magnetic field(s). Similarly, the calibration component can physically rotate the magnetometer system 10 about an axis orthogonal to the Z-axis at a predetermined rate and separating the DC and AC components of the measured magnetic field $B_Z$ to determine magnetic anomalies associated with the test fixture with respect to the Z-axis, such that the magnetic anomalies can again be canceled in the measurement of the external magnetic field(s).

Figure 7:
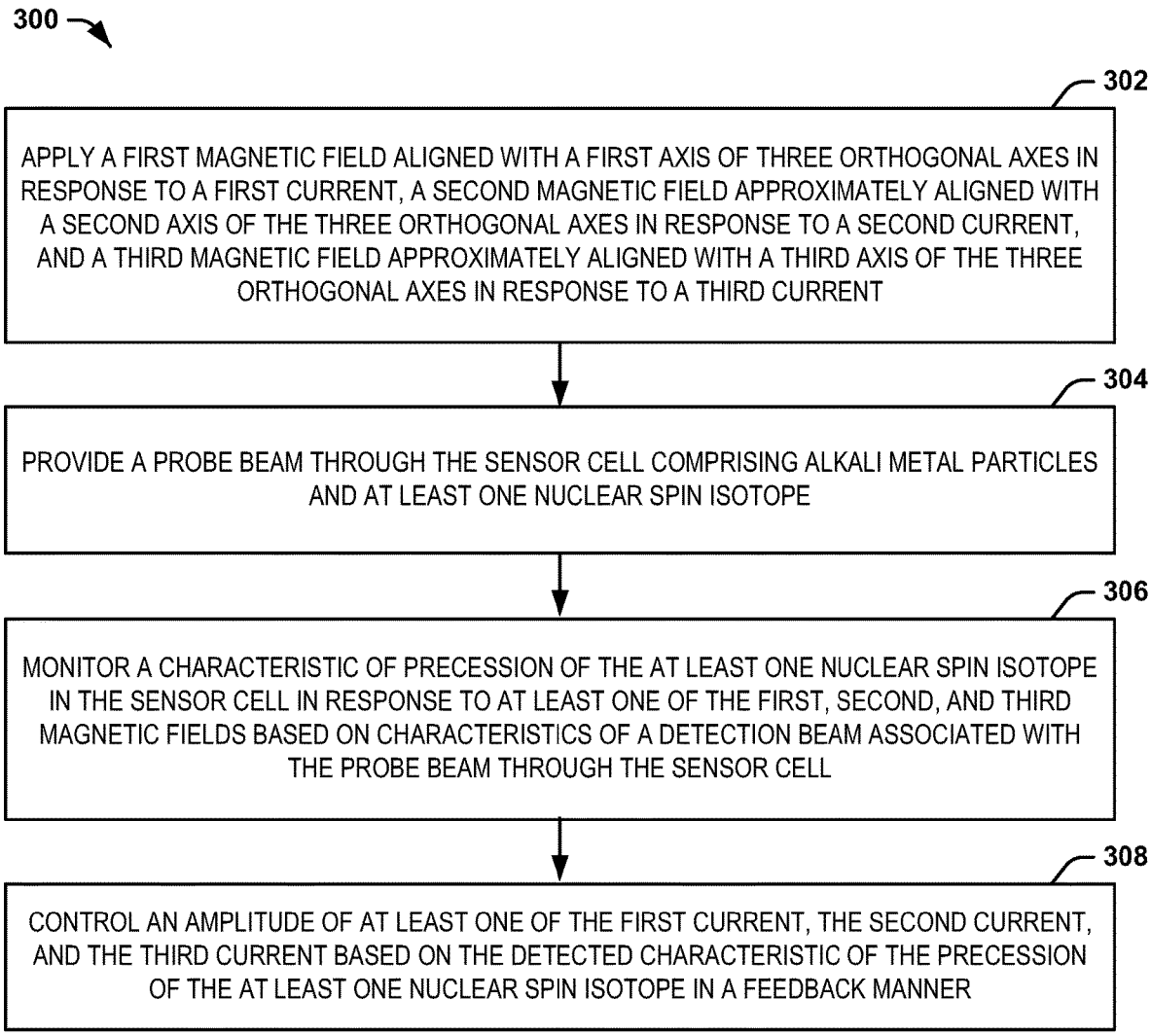
FIG. 7 illustrates an example of a method for calibrating a magnetometer.

In view of the foregoing structural and functional features described above, a methodology in accordance with various aspects of the present disclosure will be better appreciated with reference to FIG. 7. While, for purposes of simplicity of explanation, the methodology of FIG. 7 is shown and described as executing serially, it is to be understood and appreciated that the present disclosure is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present disclosure.

FIG. 7 illustrates an example of a method 300 for calibrating a magnetometer system (e.g., the magnetometer system 10). At 302, a first magnetic field (e.g., the magnetic field $B_Z$) aligned with a first axis (e.g., the Z-axis 58) of three orthogonal axes is applied in response to a first current (e.g., the current $I_Z$), a second magnetic field (e.g., the magnetic field $B_X$) approximately aligned with a second axis (e.g., the X-axis 54) of the three orthogonal axes is applied in response to a second current (e.g., the current $I_X$), and a third magnetic field (e.g., the magnetic field $B_Y$) approximately aligned with a third axis (e.g., the Y-axis 56) of the three orthogonal axes is applied in response to a third current (e.g., the current $I_Y$). At 304, a probe beam (e.g., the probe beam $O_{PRB}$) is provided through a sensor cell (e.g., the sensor cell 12) comprising alkali metal particles (e.g., the alkali metal particles 14) and at least one nuclear spin isotope (e.g., the nuclear spin isotope(s) 16). At 306, a characteristic of precession of the at least one nuclear spin isotope in the sensor cell is monitored in response to at least one of the first, second, and third magnetic fields based on characteristics of a detection beam (e.g., the detection beam $O_{DET}$) associated with the probe beam through the sensor cell. At 308, an amplitude of at least one of the first current, the second current, and the third current is controlled based on the detected characteristic of the precession of the at least one nuclear spin isotope in a feedback manner.

What have been described above are examples of the present disclosure. It is, of course, not possible to describe every conceivable combination of components or methodologies for purposes of describing the present disclosure, but one of ordinary skill in the art will recognize that many further combinations and permutations of the present disclosure are possible. Accordingly, the present disclosure is intended to embrace all such alterations, modifications and variations that fall within the spirit and scope of the appended claims.

What is claimed is:

1. A magnetometer system comprising:
   a sensor cell comprising alkali metal particles and at least one nuclear spin isotope;
   a probe laser configured to provide a probe beam through the sensor cell to generate a detection beam;
   a magnetic field system configured to generate a plurality of magnetic fields through a respective plurality of axes through the sensor cell;
   a detection system configured to implement detection of an external magnetic field based on characteristics of the detection beam in response to precession of the alkali metal particles and the at least one nuclear spin isotope based on the plurality of magnetic fields; and
   a calibration controller configured to calibrate the magnetometer system to substantially mitigate magnetic anomalies in the detected external magnetic field associated with the magnetometer system in the calibration test fixture by monitoring the detection beam in a feedback manner, the calibration controller being further configured to calibrate the magnetometer system by implementing predetermined changes to the plurality of magnetic fields and at least one predetermined physical rotation of the magnetometer system relative to each of the plurality of axes associated with a calibration test fixture to separate biases of the magnetometer system in each of the plurality of axes from the magnetic anomalies associated with the magnetometer system in the calibration test fixture.

2. The system of claim 1, wherein the calibration controller is configured to calibrate the magnetometer system based on determining a plurality of current amplitudes that are associated with the respective plurality of magnetic fields that generate a zero net magnetic field in each of the axes through the sensor cell.

3. The system of claim 1, wherein the calibration controller is configured to monitor a precession frequency of the at least one nuclear spin isotope via the detection beam at each of the predetermined changes to each of the plurality of magnetic fields in a feedback manner to calibrate the magnetometer system.

4. The system of claim 3, wherein the calibration controller comprises:
   a current controller configured to control a plurality of currents that are associated with the respective plurality of magnetic fields, the current controller being configured to square-wave modulate at least one of the plurality of currents about a DC baseline amplitude; and
   a frequency monitor configured to monitor the precession frequency of the at least one nuclear spin isotope at each modulated amplitude of the at least one of the plurality of currents to calibrate the magnetometer system.

5. The system of claim 4, wherein the frequency monitor is configured to adjust the DC baseline amplitude in a feedback manner to set the precession frequency of the at least one nuclear spin isotope equal with respect to square-wave modulation amplitudes of each of the at least one of the plurality of currents to determine the DC baseline amplitude corresponding to a zero net magnetic field amplitude along a respective one of three orthogonal axes corresponding to the respective one of the at least one of the plurality of currents.

6. The system of claim 4, wherein the calibration controller is configured to calibrate a scale-factor associated with the first, second, and third magnetic fields based on varying the amplitude of the square-wave modulation and determining the precession frequency of the at least one nuclear spin isotope at each modulated amplitude of the at least one of the plurality of currents.

7. The system of claim 1, wherein the magnetic field system is configured to generate a first magnetic field, a second magnetic field, and a third magnetic field that are each provided approximately orthogonally with respect to each other through the sensor cell.

8. The system of claim 7, wherein the plurality of axes comprise a first axis, a second axis, and a third axis, wherein the calibration controller is configured to designate the first magnetic field of the plurality of magnetic fields as being aligned with the first axis to include zero magnetic field components along the second axis and the third axis, such that a second magnetic field of the plurality of magnetic fields associated with the second axis comprises a magnetic field component associated with the first axis, and such that a third magnetic field of the plurality of magnetic fields associated with the third axis comprises magnetic field components associated with the first and second axes, wherein the calibration controller comprises a current controller configured to control a first current associated with the first magnetic field, a second current associated with the second magnetic field, and a third current associated with the third magnetic field.

9. The system of claim 8, wherein the current controller is further configured to square-wave modulate the second current at a zero amplitude of the third current and during each of a first DC current amplitude and a second DC current amplitude of the first current to determine a first DC baseline current amplitude associated with a zero net magnetic field amplitude along the second axis based on the detection beam, and to square-wave modulate the third current at a zero amplitude of the second current and during each of the first and second DC current amplitudes of the first current to determine a second DC baseline current amplitude associated with a zero net magnetic field amplitude along the third axis based on the detection beam and based on a trigonometric relationship between each of the plurality of axes.

10. The system of claim 8, further comprising a pump laser configured to generate an optical pump beam configured to stimulate the alkali metal particles to facilitate precession of the at least one nuclear spin isotope, wherein the optical pump beam is substantially aligned with the first axis.

11. The system of claim 10, wherein the calibration controller is configured to control reversal of a polarity of at least one of the optical pump beam, one of the plurality of magnetic fields, and the optical probe beam, and to calibrate the magnetometer system based on the monitored detection beam based on each polarity of the at least one of the optical pump beam, the one of the plurality of magnetic fields, and the optical probe beam in the feedback manner.

12. The system of claim 1, wherein the calibration controller is configured to provide the at least one predetermined physical rotation about a first axis at a predetermined rate and to separate AC and DC components of a measured magnetic field along a second axis orthogonal to the first axis to detect and substantially mitigate the magnetic anomalies associated with the detected measured external field.

13. A method for calibrating a magnetometer system in a calibration test fixture to substantially mitigate magnetic anomalies detected by the magnetometer system, the method comprising:
applying a first magnetic field aligned with a first axis of three orthogonal axes in response to a first current, a second magnetic field approximately aligned with a second axis of the three orthogonal axes in response to a second current, and a third magnetic field approximately aligned with a third axis of the three orthogonal axes in response to a third current;
providing a probe beam through a sensor cell comprising alkali metal particles and at least one nuclear spin isotope;
monitoring a characteristic of precession of the at least one nuclear spin isotope in the sensor cell in a feedback manner in response to at least one of the first, second, and third magnetic fields based on characteristics of a detection beam associated with the probe beam through the sensor cell; and
controlling an amplitude of at least one of the first current, the second current, and the third current based on the detected characteristic of the precession of the at least one nuclear spin isotope and implementing at least one predetermined physical rotation of the magnetometer system relative to each of the first, second, and third axes associated with the calibration test fixture to separate biases of the magnetometer system in each of the first, second and third axes from the magnetic anomalies associated with the magnetometer system in the calibration test fixture to substantially mitigate the magnetic anomalies.

14. The method of claim 13, wherein controlling the amplitude comprises controlling the amplitude of the at least one of the first current, the second current, and the third current until detecting a zero net magnetic field in each of the respective at least one of the first axis, the second axis, and the third axis.

15. The method of claim 14, wherein monitoring the characteristic of the precession of the at least one nuclear spin isotope comprises monitoring a precession frequency of the at least one nuclear spin isotope, wherein controlling the amplitude comprises: square-wave modulating each of the at least one of the first current, the second current, and the third current about a DC baseline amplitude; and
adjusting the DC baseline amplitude of a respective one of the at least one of the first current, the second current, and the third current to set the precession frequency of the at least one nuclear spin isotope equal with respect to square-wave modulation amplitudes of the respective one of the at least one of the first current, the second current, and the third current.

16. The method of claim 15, further comprising:
designating the first magnetic field as being aligned with the first axis, such that the first axis includes zero magnetic field components associated with the second magnetic field and the third magnetic field;
designating the second magnetic field as being approximately aligned with the second axis, such that the second axis includes a magnetic field component associated with the first magnetic field; and
designating the third magnetic field as being approximately aligned with the third axis, such that the third axis includes a magnetic field component associated with each of the first magnetic field and the second magnetic field;

wherein controlling the amplitude of the at least one of the first current, the second current, and the third current comprises:

controlling the second current at each of two amplitudes of the first current and at zero amplitude of the third current to determine a zero net magnetic field along the second axis based on the detected characteristic of the precession of the at least one nuclear spin isotope in a feedback manner; and controlling the third current at each of two amplitudes of the first current and at zero amplitude of the second current to determine a zero net magnetic field along the second axis based on the detected characteristic of the precession of the at least one nuclear spin isotope and based on a trigonometric relationship of the three orthogonal axes in a feedback manner.

17. The method of claim 13, wherein controlling the amplitude comprises square-wave modulating each of the first current, the second current, and the third current and varying an amplitude of the square-wave modulation of each of the first current, the second current, and the third current, wherein monitoring the characteristic of the precession of the at least one nuclear spin isotope comprises monitoring a precession frequency at each square-wave modulation amplitude of each of the first current, the second current, and the third current to calibrate a scale-factor associated with the magnetometer in each of the first, second, and third axes.

18. A combined nuclear magnetic resonance (NMR) and electron paramagnetic resonance (EPR) magnetometer system comprising:

a sensor cell comprising alkali metal particles and at least one nuclear spin isotope;

a probe laser configured to provide a probe beam through the sensor cell to generate a detection beam;

a magnetic field system configured to generate a first magnetic field aligned with a first axis of three orthogonal axes associated with the sensor cell, a second magnetic field approximately aligned with a second axis of the three orthogonal axes, and a third magnetic field approximately aligned with a third axis of the three orthogonal axes;

a detection system configured to implement NMR detection and EPR detection of an external magnetic field based on characteristics of the detection beam in response to precession of the alkali metal particles and the at least one nuclear spin isotope based on the plurality of magnetic fields; and a calibration controller comprising:

a current controller configured to control a first current, a second current, and a third current that are associated with the first magnetic field, the second magnetic field, and the third magnetic field, respectively, the current controller being configured to square-wave modulate at least one of the first, second, and third currents about a DC baseline amplitude; and a frequency monitor configured to monitor the precession frequency of the at least one nuclear spin isotope at each modulated amplitude of the at least one of the first, second, and third currents to calibrate the combined EPR and NMR magnetometer system.

19. The system of claim 18, wherein the frequency monitor is configured to adjust the DC baseline amplitude in a feedback manner to set the precession frequency of the at least one nuclear spin isotope equal with respect to square-wave modulation amplitudes of each of the at least one of the plurality of currents to determine the DC baseline amplitude corresponding to a zero net magnetic field amplitude along the respective one of the three orthogonal axes corresponding to the respective one of the at least one of the plurality of currents.

20. The system of claim 18, wherein the calibration controller is configured to calibrate a scale-factor associated with the first, second, and third magnetic fields based on varying the amplitude of the square-wave modulation and determining the precession frequency of the at least one nuclear spin isotope at each modulated amplitude of the at least one of the plurality of currents.

* * * * *